United States Patent [19]

Ogura

[11] Patent Number: 4,490,628
[45] Date of Patent: Dec. 25, 1984

[54] MOS DECODER SELECTION CIRCUIT HAVING A BARRIER TRANSISTOR WHOSE NON-CONDUCTION PERIOD IS UNAFFECTED BY SUBSTRATE POTENTIAL DISTURBANCES

[75] Inventor: Mitsugi Ogura, Yokohama, Japan

[73] Assignee: Tokyo Shibaura Denki Kabushiki Kaisha, Japan

[21] Appl. No.: 313,994

[22] Filed: Oct. 22, 1981

[30] Foreign Application Priority Data

Oct. 29, 1980 [JP] Japan ............................. 55-150623

[51] Int. Cl.³ ................ H03K 19/003; H03K 19/096; H03K 17/30; H03K 17/687
[52] U.S. Cl. .................................. 307/449; 307/578; 307/443
[58] Field of Search ............... 307/449, 463, 482, 577, 307/578, 583, 584, DIG. 4–DIG. 5, 200 B, 443; 365/230

[56] References Cited

U.S. PATENT DOCUMENTS

| | | | |
|---|---|---|---|
| 3,644,904 | 2/1972 | Baker | 307/463 X |
| 3,795,898 | 3/1974 | Mehta et al. | 307/449 X |
| 4,081,699 | 3/1978 | Hirt et al. | 307/449 X |
| 4,099,162 | 7/1978 | Basse | 307/463 X |
| 4,145,622 | 3/1979 | Hofmann et al. | 307/449 |
| 4,267,464 | 5/1981 | Takemae | 307/463 |

FOREIGN PATENT DOCUMENTS

| | | |
|---|---|---|
| 2658655 | 7/1977 | Fed. Rep. of Germany . |
| 2708702 | 9/1977 | Fed. Rep. of Germany . |
| 2716459 | 1/1978 | Fed. Rep. of Germany . |
| 122939 | 9/1979 | Japan ............................. 307/449 |

OTHER PUBLICATIONS

Dockerty et al., "Enhancement/Depletion Decoder Circuit", IBM Technical Disclosure Bulletin, vol. 19, No. 5, Oct. 1976.

Huffman et al., "Memory Address Decode Circuit", IBM Technical Disclosure Bulletin, vol. 19, No. 1, Jun. 1976.

Itoh et al., 1980 IEEE International Solid–State Circuits Conference, Digest of Technical Papers, pp. 228–229, (2/15/1980).

Primary Examiner—Larry N. Anagnos
Attorney, Agent, or Firm—Finnegan, Henderson, Farabow, Garrett & Dunner

[57] ABSTRACT

Disclosed is a semiconductor integrated circuit device, which comprises at least one selection circuit including a first node, a first MOS transistor for periodically pre-charging the first node, second MOS transistors for determining the potential state of the first node in response to a state designating signal, a third MOS transistor connected to the first node and functioning as a barrier, a second node connected through the barrier MOS transistor to the first node, a fourth MOS transistor for providing a signal at a level corresponding to the potential state of the second node, and a control circuit for holding the gate potential of the barrier MOS transistor at a low level for a period from the instant when the potential state of the first node is determined till the subsequent pre-charge cycle.

11 Claims, 12 Drawing Figures

U.S. Patent  Dec. 25, 1984  Sheet 1 of 4  4,490,628
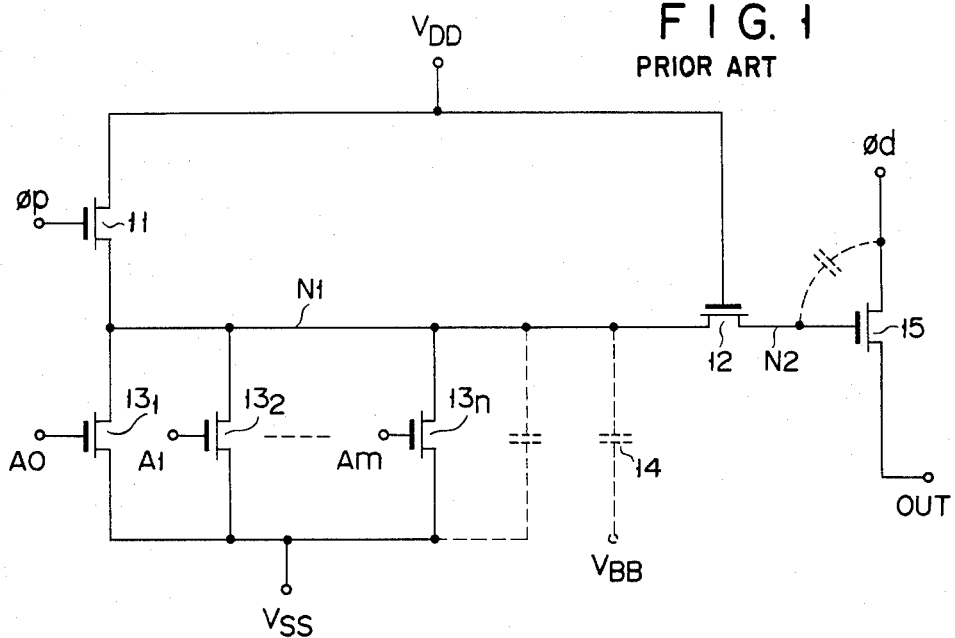
FIG. 1
PRIOR ART
PRIOR ART
FIG. 2A  φp
FIG. 2B  A0
FIG. 2C  φd
FIG. 2D  N1
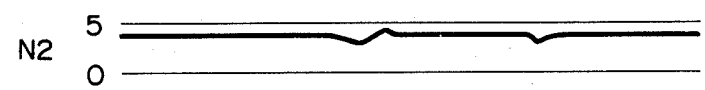
FIG. 2E  N2
FIG. 2F  OUT
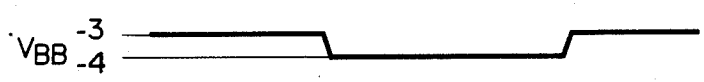
FIG. 2G  $V_{BB}$

MOS DECODER SELECTION CIRCUIT HAVING A BARRIER TRANSISTOR WHOSE NON-CONDUCTION PERIOD IS UNAFFECTED BY SUBSTRATE POTENTIAL DISTURBANCES

BACKGROUND OF THE INVENTION

This invention relates to semiconductor integrated circuit devices including substrate-bias generation circuits.

Recently, there have been proposed various large scale integration (LSI) circuits that include substrate-bias generation circuits. These circuits are intended to reduce the PN junction capacity of diffusion layers for increasing the device operation speed and stabilizing the threshold voltage $V_T$ of metal oxide semiconductor (MOS) transistors.

Also, these circuits are sometimes intended for the purpose of meeting dynamic random access memories (RAM). More particularly, they may be intended to reduce the number of necessary external power sources by replacing the prior art dynamic RAM which is of a type requiring two power sources with one requiring only a single power source.

In the meantime, the current supply capacity of the prior art substrate-bias generation circuit is low, usually of the order of 10 $\mu$A. In this case, the substrate is susceptible to external or internal noise, and are prone to potential fluctuations. For example, it has been known that with a dynamic RAM the substrate potential is subject to periodic variations by 1 to 2 V due to such cases as the charging and discharging of an address decoder or a bit line. Such substrate potential fluctuations adversely affect the operation of the LSI and cause malfunction thereof.

FIG. 1 shows a prior art address decoder circuit which is generally used for a dynamic RAM or the like. FIGS. 2A through 2G serve as a timing chart showing potentials at various parts of the circuit of FIG. 1 at the time of an erroneous operation.

The operation of the circuit shown in FIG. 1 will now be described with reference to FIG. 2A through 2G.

In a pre-charge cycle, a pre-charge control signal $\phi_p$ (FIG. 2A) is equal to a power source potential $V_{DD}$ (for instance 5 V), and nodes $N_1$ and $N_2$ are pre-charged (FIGS. 2D and 2E). The pre-charge level is lower than the power source potential $V_{DD}$ (for instance 5 V) by a threshold voltage $V_T$ of MOS transistors 11 and 12 (for instance about 0.8 V); that is, it is $V_{DD}-V_T$ (for instance about 4.2 V). When an active cycle sets in with the signal $\phi_p$ reduced to 0 V after the pre-charge cycle has been ended, address signals $A_0$ (FIG. 2B), $A_1, \ldots,$ $A_m$ are coupled to respective MOS transistors $13_1$, $13_2$, $\ldots$, $13_m$. The transistors $13_1$ to $13_m$ are individually on-off operated according to the content of the respective address signals $A_0$ to $A_m$. When one of the transistors $13_1$ to $13_m$ is triggered, the nodes $N_1$ and $N_2$ are discharged to 0 V through that transistor. When none of the transistors is triggered, the nodes $N_1$ and $N_2$ are not discharged, and a floating state at a high level $(V_{DD}-V_T)$ is maintained. When the circuit serves as a decoder circuit, a non-selected state is obtained with the discharge of the nodes to 0 V, and a selected state corresponds to the nodes not discharged but at the floating level.

If the substrate potential $V_{BB}$ (FIG. 2G) changes from, for instance, $-3$ V to $-4$ V with the discharge of a bit line while the nodes $N_1$ and $N_2$ are in a floating state, the potential on the node $N_1$ is reduced due to a coupling capacitor 14 between the node $N_1$ and substrate. In the IC device, the node $N_1$ is formed by a diffusion region. Thus, a high PN junction capacitance is present between the node $N_1$ and substrate. This PN junction capacitance occupies 79 to 80% of the load capacitance of the node $N_1$. The potential on the node $N_1$ is thus reduced from the potential $V_{DD}-V_T$ (being about 4.2 V) by an amount corresponding to the voltage drop $\Delta V_{BN}$ (for instance 0.7 V) due to a change of the substrate potential to be $V_{DD}-V_T-\Delta V_{BN}$ (for instance about 3.5 V). As a result, a MOS transistor 12, which has been in the cut-off state or in a high impedance state close thereto owing to the presence of a relation $V_G-V_S \leq V_T$ between its gate potential $V_G$ and the source potential (potential on the node $N_2$), is rendered into the "on" state where a relation $V_G-V_S > V_T$ holds or a low impedance state close thereto. Thus, the potential on the node $N_2$ is reduced to be substantially equal to the potential on the node $N_1$ (for instance about 3.6 V), that is, the potential level becomes lower than $V_{DD}-V_T$.

When a drive signal $\phi_d$ (FIG. 2C) is coupled to a transistor 15 in this state, the potential of the channel under the gate of the transistor 15 is increased substantially in synchronism to the drive signal $\phi_d$. As a result, the gate potential on the transistor 15 (i.e., the potential on the node $N_2$) tends to increase due to the coupling capacitance between the gate and channel. However, the rise of the potential on the node $N_2$ is suppressed by the transistor 12 which is "on" at this time. This means that only a low potential signal (for instance about 2.8 V) (FIG. 2F), which is the result of subtraction of the threshold potential (for instance 0.8 V) of the transistor 15 from the potential (about 3.6 V) on the node $N_2$, will appear at an output terminal OUT, that is, the output signal potential will be inevitably low.

In the meantime, in a dynamic RAM, which has its output terminal OUT connected to the gate of a read/write transistor in a memory cell or to the gate of a read/write transistor in a bit line, reliable reading and writing cannot be ensured unless a signal of a sufficient level is obtained from the output terminal OUT. In addition, if the signal level at the output terminal OUT is reduced, the source voltage range of the RAM can no longer cover a sufficiently low potential, which is liable to adversely affect the reliability of the product or the yield of manufacture.

SUMMARY OF THE INVENTION

An object of this invention is to provide a semiconductor device which can be stably operated even if a variation occurs in the potential of the semiconductor substrate.

According to the invention, there is provided a semiconductor integrated circuit device, which comprises at least one selection circuit including a first node, first means for periodically pre-charging the first node, second means for determining the potential state of the first node in response to a state designating signal, a first MOS transistor connected to the first node and functioning as a barrier, a second node connected through the barrier MOS transistor to the first node, third means for providing a signal at a level corresponding to the potential state of the second node, and a control circuit for holding the gate potential of the barrier MOS transistor at a low level for a period from the instant when the potential state of the first node is determined till the subsequent pre-charge cycle.

BRIEF DESCRIPTION OF THE DRAWINGS

FIG. 1 is a circuit diagram showing a prior art address decoder circuit;

FIGS. 2A to 2G serve as a timing chart useful to explain the operation of the address decoder shown in FIG. 1;

DESCRIPTION OF THE PREFERRED EMBODIMENTS

Figure 3:
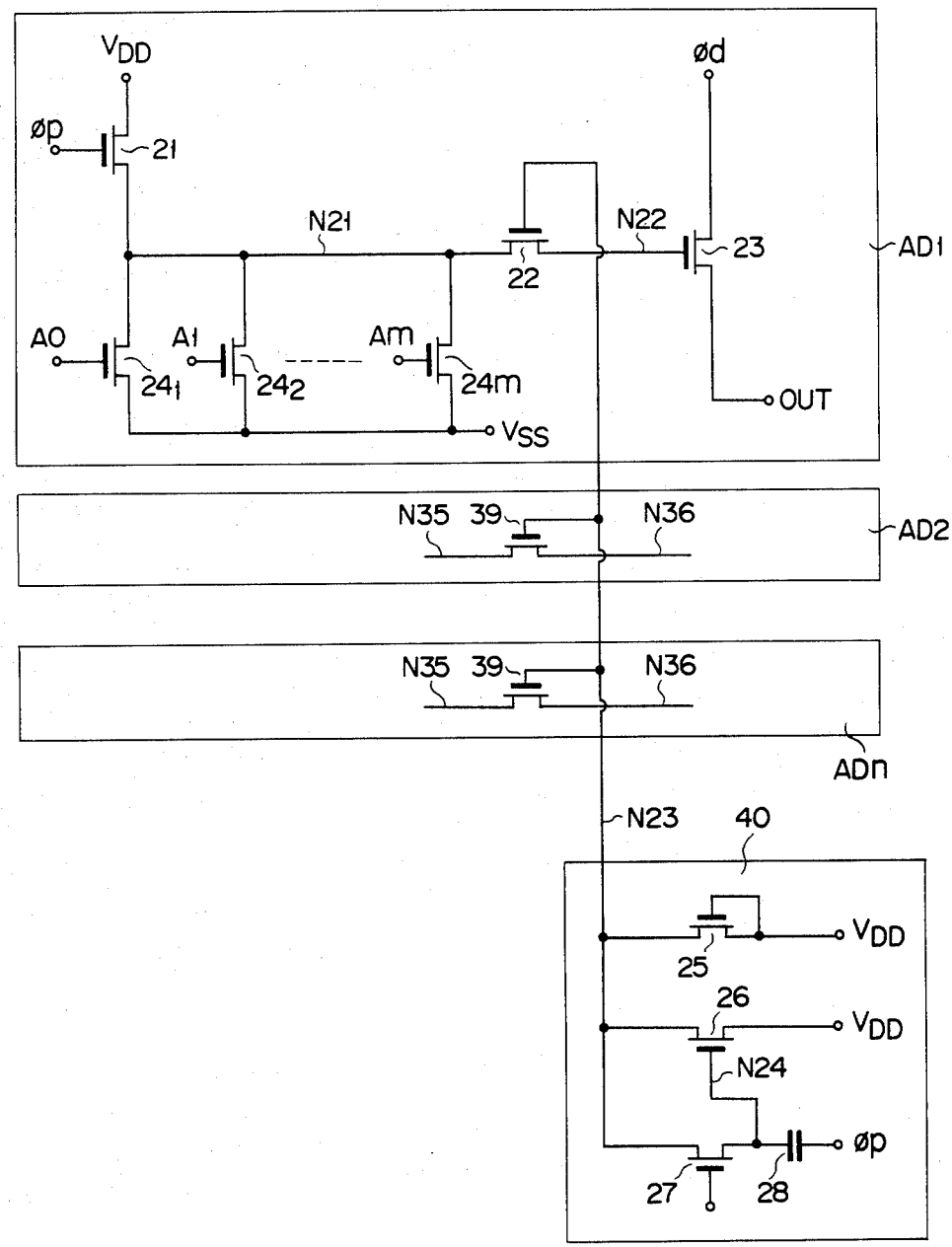
FIG. 3 is a circuit diagram showing an embodiment of a semiconductor integrated circuit device according to the invention.

FIG. 3 shows an embodiment of the semiconductor integrated circuit device according to the invention applied to an address decoder. Address decoders $AD_1$, $AD_2$, ..., $AD_n$ all have the same construction. Thus, the construction of only a typical address decoder, namely the address decoder $AD_1$, will be described in detail, and the construction of the other address decoders $AD_2$ to $AD_n$ is illustrated only for a portion thereof which is necessary for the following description. For the simplicity of illustration and description, barrier transistors in the address decoders $AD_2$ to $AD_n$ that correspond to a barrier transistor 22 in the address decoder $AD_1$ are designated alike by reference numeral 39. Similarly, nodes in the address decoders $AD_2$ to $AD_n$ corresponding to the respective nodes $N_{21}$ and $N_{22}$ in the address decoder $AD_1$ are designated alike by respective reference numerals $N_{35}$ and $N_{36}$.

The construction will first be described.

A MOS transistor 21 has its drain connected to a power source potential $V_{DD}$ and its source connected to the node $N_{21}$. The node $N_{21}$ is also connected to the source of the MOS transistor 22 which serves as the barrier transistor. The drain of the transistor 22 is connected to the gate of the MOS transistor 23. The transistor 23 has its drain supplied with the drive signal $\phi_d$ and its source connected to an output terminal OUT. A plurality of MOS transistors $24_1$, $24_2$, ..., $24_m$ are connected between the node $N_{21}$ and power source potential $V_{SS}$. These MOS transistors $24_1$ to $24_m$ each has its drain connected to the node $N_{21}$ and its source connected to the source potential $V_{SS}$. The gate of the barrier transistor 22 is connected to the node $N_{23}$. Also, the gates of the barrier transistors 39 of all the other address decoder circuits $AD_2$ to $AD_n$ are connected to the node $N_{23}$. The node $N_{23}$ is connected to a control circuit 40 for controlling the potential on the node $N_{23}$.

The control circuit 40 includes MOS transistors 25, 26 and 27 and a capacitor 28. The MOS transistor 25 has its source connected to the node $N_{23}$ and its drain connected to the power source potential $V_{DD}$. Also, its gate and drain are connected to each other. The transistor 26 has its source connected to the node $N_{23}$ and its drain connected to the power source potential $V_{DD}$. The transistor 27 has its drain connected to the node $N_{23}$.

The source of the transistor 27 is connected to one electrode plate of the capacitor 28. The other electrode plate of the capacitor 28 is connected to a terminal to which the signal $\phi_p$ is supplied. The source of the transistor 27 is also connected to the gate of the transistor 26. The gate of the transistor 27 is also connected to the power source potential $V_{DD}$.

The operation of the circuit device having the above construction will now be described.

For the sake of simplicity, it is assumed that the address decoder $AD_1$ is deemed to be a selected state address decoder while the other address decoders $AD_2$ to $AD_n$ are deemed to be non-selected state address decoders ("n" is equal to $2^{(m+1)}$). The lower source potentials $V_{DD}$ and $V_{SS}$ and signals $\phi_p$ and $\phi_d$ are the same as those shown in FIGS. 1 and 2, and hence the same symbols are used.

When the pre-charge cycle sets in, the pre-charge control signal $\phi_p$ goes to the source potential level $V_{DD}$, thus triggering the transistor 21. As a result, the nodes $N_{21}$ and $N_{22}$ of the address decoder $AD_1$ and the nodes $N_{35}$ and $N_{36}$ of the address decoders $AD_2$ to $AD_n$ are pre-charged up to the potential $V_{DD}\Delta V_T$ (i.e., the threshold voltage of the transistors 21 and 22). At this time, the potential on the nodes $N_{24}$ connecting the source of the transistor 27 and the gate of the transistor 26 is bootstrapped by the capacitor 28 to a level in excess of $V_{DD}+V_T$. Thus, a substantially triode action is obtained with the transistor 26 to fix the node $N_{23}$ at the potential $V_{DD}$.

When the signal $\phi_p$ goes to 0 V, the potential on the node $N_{24}$ is also reduced due to coupling by the capacitor 28 substantially to $V_{DD}-V_T$ to cut off the transistor 26. Since the transistor 25 is always "off" during the pre-charge cycle, the node $N_{23}$ is in the floating state at this time.

When address signals $A_0$ to $A_m$ (which is expressed as a state designating signal in the specification) are coupled in this state, the nodes $N_{21}$ and $N_{22}$ are held at a high level floating state since the transistors $24_1$ to $24_m$ in the address decoder $AD_1$ are all "off" (since it has been assumed that the address decoder $AD_1$ is deemed to be a selected address decoder). While the nodes $N_{35}$ and $N_{36}$ of the other address decoders $AD_2$ to $AD_n$ are all discharged. At this time, the potential on the node $N_{23}$ is considerably reduced due to the coupling capacitance between the channel and gate of the barrier transistor 39.

When the potential level of the node $N_{23}$ is reduced from $V_{DD}-V_T$, the transistor 25 is triggered. In this way, the potential level of the node $N_{23}$ is fixed to $V_{DD}-V_T$.

Now, what happens when the potential on the substrate (not shown) is varied in this state so that the potential on the node $N_{21}$ of the selected state address decoder $AD_1$ is reduced from $V_{DD}-V_T$ by $\Delta V_{BN}$, will be considered. At this time, the gate potential on the transistor 22 is $V_G$, and its source potential is $V_{DD}-VT-\Delta V_{BN}$. The transistor 22 is "off" at this time if $V_G-V_S \leq V_T$. Actually, the transistor 22 is "off" because the threshold voltage $V_T$ of the transistor 22 is usually about 0.8 V while the voltage drop $\Delta V_{BN}$ due to variation of the substrate potential is about 0.7 V so that the condition $V_G-V_S \leq V_T$ holds. If the threshold voltage $V_T$ of the barrier transistors 22 and 39 is made higher than the threshold voltage of the other transistors, the transistor 22 can be more reliably held "off" with increase of the voltage drop $\Delta V_{BN}$, and hence more stable circuit operation can be obtained. The threshold voltage of the transistors 22 and 39 may be increased by, for instance, increasing the impurity concentration of the channel region through ion implantation. Alternatively, a method of making use of a short channel effect by making the channel length of the transistors 22 and 39 greater than that of the other transistors or a method in which the film thickness of the gate of the transistors 22 and 39 is made greater than that of the other transistors may be used to increase the threshold voltage of the transistors 22 and 39.

When the drive signal $\phi_d$ is coupled, the node $N_{22}$ is sufficiently bootstrapped since the transistor 22 in the address decoder $AD_1$ is in the cut-off state. Thus, a signal at the level of the drain signal $\phi_p$ (for instance 5 V) can be obtained without any attenuation from the output terminal OUT of the address decoder $AD_1$. Also, at this time no signal appears from the output terminal OUT of the other address decoders $AD_2$ to $AD_n$ in the non-selected state because the nodes $N_{36}$ of these address decoders $AD_2$ to $AD_n$ are 0 V. In this way, only the address decoder $AD_1$ is selected. During this active cycle, the node $N_{24}$ in the control circuit 40 is held at a potential $V_{DD}-V_T$ by the transistor 27.

When the active cycle is ended with the change of the drive signal $\phi_d$ to 0 V, the level of the signal $\phi_p$ is increased up to $V_{DD}$. As a result, the pre-charge cycle sets in again. That is, the nodes $N_{35}$ and $N_{36}$ of the address decoders $AD_2$ to $AD_n$ which have been in the discharged state are pre-charged again, and the potential on the node $N_{23}$ is increased owing to the coupling capacitance. Also, the potential on the node $N_{24}$ is bootstrapped by the capacitor 28 to a level higher than $V_{DD}+V_T$ to trigger the transistor 26, whereby the potential level of the node $N_{23}$ is fixed to $V_{DD}$.

Figure 4:
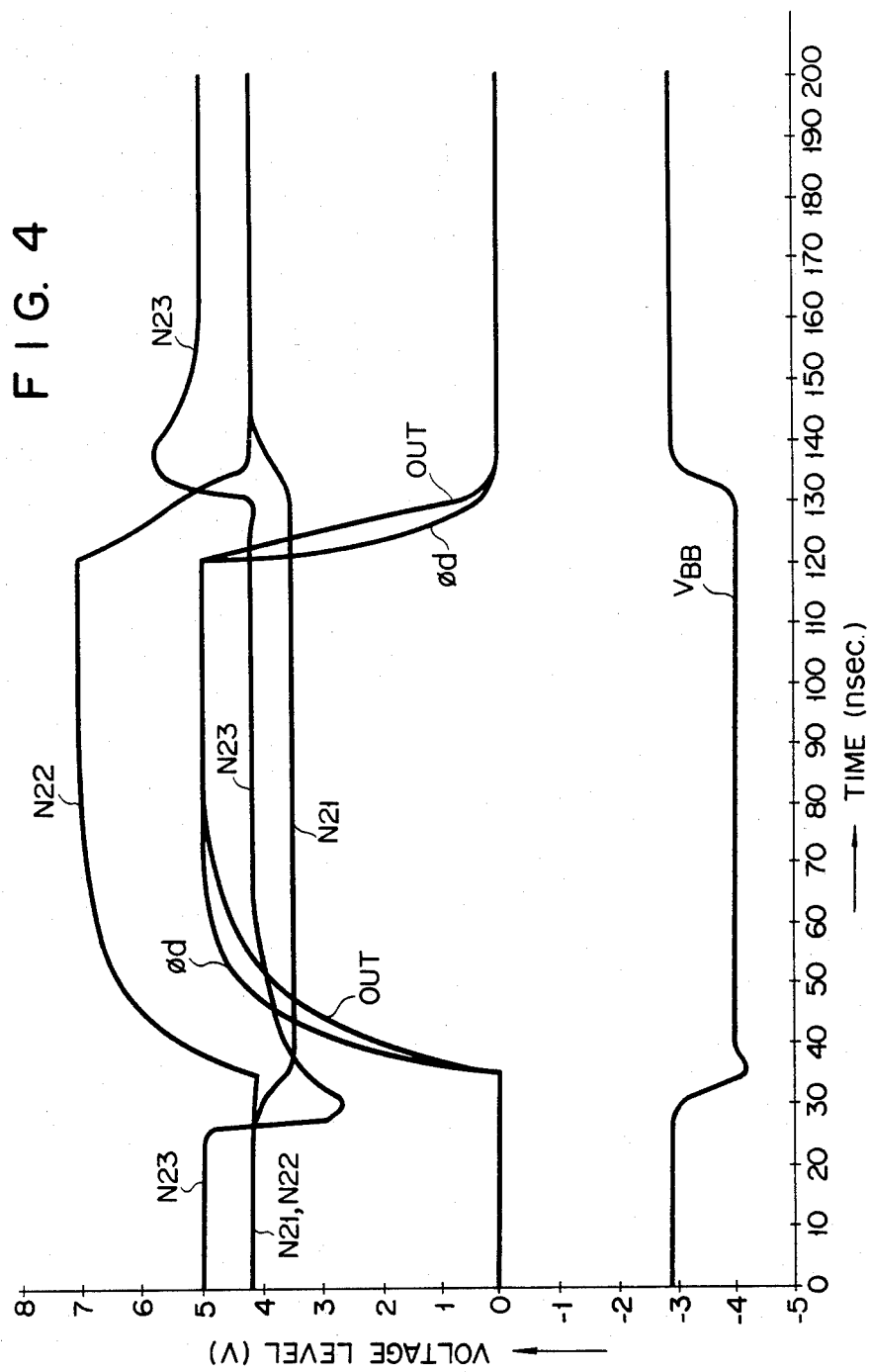
FIG. 4 is a simulation timing chart useful to explain the operation of the circuit device shown in FIG. 3.

FIG. 4 shows the results of computer simulation of the potential levels of the nodes $N_{21}$, $N_{22}$ and $N_{23}$, the drive signal $\phi_d$, the output signal from the output terminal OUT and the potential $V_{BB}$ on the substrate during one cycle constituted by the pre-charge and active cycles.

With the embodiment described above, the drive signal $\phi_d$ can be obtained without any level attenuation from the selected state address decoder irrespective of substrate potential fluctuations, so that it is possible to ensure reliable read and write operations with respect to data in the following state memory cells, for instance. It is thus possible to realize a dynamic RAM including a substrate bias generation circuit. In addition, where a substrate bias generation circuit is provided as an internal component, there is no need of providing the external $V_{BB}$ voltage source, that is, it is possible to reduce the number of the external voltage sources necessary to the memory device by one. Further, in the fabrication of a memory board there is no need of providing a conductive line for the $V_{BB}$ voltage source, so that it is possible to improve the RAM integration density of the memory board and reduce cost thereof.

Further, since there is no need of minimizing the substrate potential fluctuations, no stabilized capacitor has to be provided on the chip. Hitherto, to suppress the substrate potential fluctuations a 64-k dynamic RAM, for instance, has required a gate insulation film area of 1.5 mm$^2$ if the thickness of the gate insulation film is 400 Å. This area corresponds to about 6% of the chip area. With the above embodiment, the necessary chip can be reduced that much to permit improvement of the integration density, improvement of yield and reduction of cost.

Further, since the influence of the substrate potential fluctuations is reduced, easier LSI design is possible to reduce cost.

Furthermore, the range of variation of the potential on the node $N_{23}$ is between the power source potential $V_{DD}$ and potential $V_{DD}-V_T$, the potential level of the node $N_{23}$ is substantially $V_{DD}-V_T$ even when the potential on the node $N_{22}$ is bootstrapped to a level higher than the power source potential level $V_{DD}$ with the appearance of the signal $\phi_d$. Thus, there is no possibility of breakdown on the drain electrode side of the transistor 22 (i.e., on the side of the node $N_{22}$). Where the node $N_{23}$ is held at 0 V, for instance, fine structure transistors constituting 64-k dynamic RAMs or 16-k static RAMs are readily prone to breakdown. In this viewpoint, the above embodiment, in which the node $N_{23}$ is held not at 0 V but at the level $V_{DD}-V_T$ when the node $N_{22}$ is bootstrapped, gives a high breakdown voltage to the element in effect.

Moreover, by making the potential level on the node $N_{23}$ to be higher than the threshold voltage $V_T$ of the transistors 22 and 39 during the active cycle, it is possible to prevent erroneous selection of the nonselected state address decoders.

If the transistors 22 and 39 are triggered with the node $N_{23}$ held at a potential lower than the threshold voltage of the transistors 22 and 39, the node $N_{36}$ is brought to the floating state after it is discharged by the address signal. If a coupling capacitance is present between the drain of the transistor 23 and the node $N_{36}$, it is possible that the transistor 23 is triggered with an increase of the potential on the node $N_{36}$ caused due to the coupling capacitance. In such a case, a malfunction occurs to provide the signal $\phi_d$ from the output terminal OUT of the non-selected address decoders $AD_2$ to $AD_n$. Actually, in the MOS transistor a diffusion region constituting the drain or source region is usually present under the gate electrode, that is, a coupling capacitance as mentioned is present in the transistor 23, and the malfunction is likely from this ground.

Further, since a higher potential level than the power source potential $V_{DD}$ is temporarily obtained on the node $N_{23}$ at the time of the pre-charge cycle, the node $N_{22}$ can be readily pre-charged and the pre-charging potential level can be increased.

Figure 5:
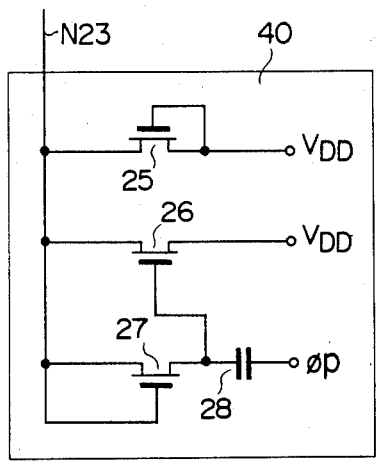
FIG. 5 is a circuit diagram showing a different example of the control circuit in the circuit device of FIG. 3.
Figure 6:
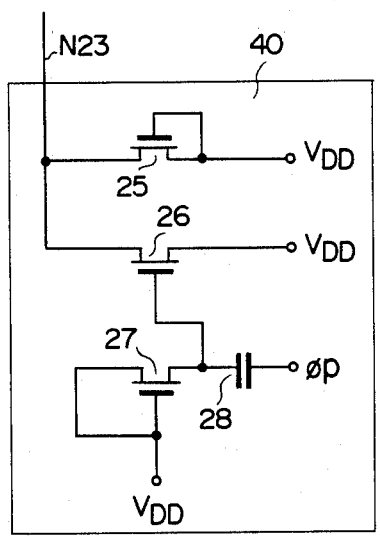
FIG. 6 is a circuit diagram showing a further different example of the control circuit in the circuit device of FIG. 3.

The above embodiment is by no means limitative, and can be variously modified. For example, the gate of the transistor 27 in the control circuit 40 may be connected to the node $N_{23}$, as shown in FIG. 5. Also, the transistor 27 in the control circuit 40 may have its gate and drain connected to the power source potential $V_{DD}$ and its source connected to the node $N_{24}$, as shown in FIG. 6. These modified constructions may have the same function as that of the control circuit 40 shown in FIG. 3, i.e., the function of holding the node $N_{24}$ at the potential $V_{DD}-V_T$ during the active cycle.

Further, in the embodiment of FIG. 3, the channel length of the transistors 22 and 39 in the address decoders $AD_1$ to $AD_n$ may be made greater compared to the transistor 24 (generally referring to the transistors $24_1$ to $24_m$) to enhance the barrier function and thus improve the breakdown voltage between the nodes $N_{21}$ and $N_{22}$ (or between the nodes $N_{25}$ and $N_{26}$) against punch-through.

Further, in the embodiment of FIG. 3, the threshold voltages $V_{T1}$, $V_{T2}$ and $V_{T4}$ of the transistors 21, 22 and 24 may be set such as to satisfy a relation:

$$V_{T1} \leq V_{T4} \leq V_{T2} \qquad 5$$

With this construction, the device can be less susceptible to the substrate potential fluctuations. The relation mentioned above may be realized by setting different channel lengths for the individual transistors 21, 22 and 24. In this case, it is desirable to set the channel lengths of the individual transistors 21, 22 and 24 such that each differs from another by 10% or more in order to obtain an effective function by the short channel effect and minimize the substrate potential fluctuations. Instead of setting different channel lengths of the individual transistors 21, 22 and 24 for meeting the afore-mentioned relation, it is also possible to set different gate insulation film thicknesses or channel region impurity concentrations for these transistors.

Further, while the above embodiment of FIG. 3 has used the control circuit 40 functioning to change the potential level of the node $N_{23}$ from the power source potential level $V_{DD}$ to $V_{DD}-V_T$, this function is by no means limitative. In general, it is necessary to provide a function of changing the potential level on the node $N_{23}$ within a range, for instance, between the power source potential level $V_{DD}$ and a certain level about 0 V. The lower limit, however, is desirably about $V_T$ above or below $V_{DD}-V_T$ at the most.

Further, while the above embodiment of FIG. 3 has concerned with address decoders, this is not limitative, and the invention is applicable for use with any circuit, which includes a barrier transistor and a floating node connected thereto and subject to substrate potential fluctuations.

Further, in the above embodiment of FIG. 3 the signal supplied to the capacitance 28 of the control circuit 40 is not limited to the signal $\phi_p$ for pre-charging the address decoder, but any signal may be used insofar as it triggers the transistor 26 to bootstrap the node $N_{24}$ to a predetermined potential, for instance the potential $V_{DD}$, during the pre-charge cycle and becomes 0 V before the impression of the address signal.

It is to be understood that in general various changes and modifications of the above embodiment are possible without departing from the scope and spirit of the invention.

What is claimed is:

1. A semiconductor integrated circuit device comprising:
at least one selection circuit including-
a first node;
first means for periodically pre-charging said first node;
second means for determining the potential state of said first node in response to a state designating signal;
a first MOS transistor connected to said first node and functioning as a barrier;
a second node connected through said barrier of said first MOS transistor to said first node;
third means for providing a signal at a level corresponding to the potential state of said second node; and
a control circuit means for holding the gate potential of said barrier MOS transistor at a low level for a period from the instant when the potential state of said first node is determined until a subsequent pre-charge cycle, including a third node connected to a gate of said barrier MOS transistor, a second MOS transistor connected between said third node and a power source potential terminal and having a gate and a drain connected to each other, a third MOS transistor connected between said third node and said power source potential terminal and having a gate connected to a fourth node, a capacitance element connected to said fourth node, a high-level signal being applied to said capacitance element during the pre-charge cycle, and control means connected to said fourth node, for controlling the potential state of said fourth node.

2. A semiconductor integrated circuit device according to claim 1, wherein said control circuit means includes a fourth MOS transistor having a source connected to said fourth node, a drain connected to said third node and the gate connected to said power source potential terminal.

3. A semiconductor integrated circuit device according to claim 1, wherein said control circuit means includes a fourth MOS transistor having a source connected to said fourth node and a drain and a gate connected to said third node.

4. A semiconductor integrated circuit device according to claim 1, wherein said control circuit means includes a fourth MOS transistor having a source connected to said fourth node and a drain and a gate connected to said power source potential terminal.

5. A semiconductor integrated circuit device comprising:
at least one selection circuit including a first node;
first means for periodically pre-charging said first node;
second means for determining the potential state of said first node in response to a state designating signal;
a first MOS transistor connected to said first node and functioning as a barrier;
a second node connected through said barrier of said first MOS transistor to said first node;
third means for providing a signal at a level corresponding to the potential state of said second node; and
a control circuit means for holding the gate potential of said barrier MOS transistor at a potential of $V_{DD}-V_T$ for a period from the instant when the potential state of said first node is determined until a subsequent pre-charge cycle, wherein $V_{DD}$ denotes a power source potential and $V_T$ denotes the threshold voltage of said barrier MOS transistor and wherein said first, second and third means include respective MOS transistors, and the threshold voltage of said barrier MOS transistor is set to be higher than that of said MOS transistors of said first, second and third means.

6. A semiconductor integrated circuit device comprising:
at least one selection circuit including a first node;
first means for periodically pre-charging said first node;
second means for determining the potential state of said first node in response to a state designating signal;
a first MOS transistor connected to said first node and functioning as a barrier;

a second node connected through said barrier of said first MOS transistor to said first node;

third means for providing a signal at a level corresponding to the potential state of said second node; and a control circuit means for holding the gate potential of said barrier MOS transistor at a potential of $V_{DD}-V_T$ for a period from the instant when the potential state of said first node is determined until a subsequent pre-charge cycle, wherein $V_{DD}$ denotes a power source potential and $V_T$ denotes the threshold voltage of said barrier MOS transistor and wherein said first and second means include respective MOS transistors, and the channel length of said barrier MOS transistor is greater by 10% or more than those of the MOS transistors of said first and second means.

7. A semiconductor integrated circuit device comprising:

at least one selection circuit including a first node;

first means for periodically pre-charging said first node;

second means for determining the potential state of said first node in response to a state designating signal;

a first MOS transistor connected to said first node and functioning as a barrier;

a second node connected through said barrier of said first MOS transistor to said first node;

third means for providing a signal at a level corresponding to the potential state of said second node; and a control circuit means for holding the gate potential of said barrier MOS transistor at a potential of $V_{DD}-V_T$ for a period from the instant when the potential state of said first node is determined until a subsequent pre-charge cycle, wherein $V_{DD}$ denotes a power source potential and $V_T$ denotes the threshold voltage of said barrier MOS transistor and wherein said control circuit means includes a third node connected to a gate of said barrier MOS transistor, a second MOS transistor connected between said third node and said power source potential and having a gate and a drain connected to each other, a third MOS transistor connected between said third node and said power source potential and having a gate connected to a fourth node, a capacitance element connected to said fourth node, said power source potential being applied to said capacitance element during a pre-charge cycle, and control means connected to said fourth node, for controlling a potential state of said fourth node.

8. A semiconductor integrated circuit device according to claim 7, wherein said control circuit means includes a fourth MOS transistor having a source connected to said fourth node, a drain connected to said third node and a gate connected to said power source potential terminal.

9. A semiconductor integrated circuit device according to claim 7, wherein said control circuit means includes a fourth MOS transistor having a source connected to said fourth node and the drain and gate connected to said third node.

10. A semiconductor integrated circuit device according to claim 7, wherein said control circuit means includes a fourth MOS transistor having a source connected to said fourth node and a drain and a gate connected to said power source potential terminal.

11. A semiconductor integrated circuit device comprising:

at least one selection circuit including a first node;

first means for periodically pre-charging said first node;

second means for determining the potential state of said first node in response to a state designating signal;

a first MOS transistor connected to said first node and functioning as a barrier;

a second node connected through said barrier of said first MOS transistor to said first node;

third means for providing a signal at a level corresponding to the potential state of said second node; and control means comprising a third node connected to a gate of said barrier MOS transistor, a second MOS transistor connected between said third node and a power source potential terminal and having a gate and a drain connected to each other, a third MOS transistor connected between said third node and said power source potential terminal and having a gate connected to a fourth node, and a control circuit connected to said fourth node for controlling said third MOS transistor and thereby holding the potential of said third node to a low level for a period from the instant when the potential state of said first node is determined until a subsequent pre-charge cycle.

* * * * *